(12) United States Patent
Choi

(10) Patent No.: US 7,656,729 B2
(45) Date of Patent: Feb. 2, 2010

(54) CIRCUIT AND METHOD FOR DECODING COLUMN ADDRESSES IN SEMICONDUCTOR MEMORY APPARATUS

(75) Inventor: Hong-Sok Choi, Ichon (KR)

(73) Assignee: Hynix Semiconductor, Inc. (KR)

( * ) Notice: Subject to any disclaimer, the term of this patent is extended or adjusted under 35 U.S.C. 154(b) by 32 days.

(21) Appl. No.: 11/961,998

(22) Filed: Dec. 20, 2007

(65) Prior Publication Data

US 2008/0192562 A1    Aug. 14, 2008

(30) Foreign Application Priority Data

Feb. 12, 2007    (KR) .................... 10-2007-0014572

(51) Int. Cl.
*G11C 29/00*    (2006.01)
*G11C 8/00*    (2006.01)

(52) U.S. Cl. .................. 365/201; 365/230.06

(58) Field of Classification Search ............... 365/201
See application file for complete search history.

(56) References Cited

U.S. PATENT DOCUMENTS

| | | | | |
|---|---|---|---|---|
| 5,086,413 | A * | 2/1992 | Tsuboi et al. ......... | 365/230.01 |
| 5,268,868 | A * | 12/1993 | Kajigaya et al. ........... | 365/206 |
| 5,394,369 | A * | 2/1995 | Kagami ..................... | 365/200 |
| 5,708,612 | A * | 1/1998 | Abe ........................... | 365/200 |
| 5,933,379 | A * | 8/1999 | Park et al. .................. | 365/201 |
| 6,546,512 | B1 | 4/2003 | Ochoa et al. | |
| 6,564,287 | B1 | 5/2003 | Lee | |
| 6,636,446 | B2 | 10/2003 | Lee et al. | |
| 6,643,805 | B1 * | 11/2003 | Kikutake et al. ........... | 714/718 |
| 6,751,128 | B2 * | 6/2004 | Kuroki et al. .......... | 365/189.04 |
| 7,055,012 | B2 | 5/2006 | LaBerge et al. | |
| 7,263,638 | B2 * | 8/2007 | Hokenmaier ................ | 714/719 |
| 2005/0063238 | A1 * | 3/2005 | Nambu et al. ............... | 365/222 |
| 2005/0105363 | A1 | 5/2005 | Ko | |
| 2005/0201183 | A1 | 9/2005 | Ho | |
| 2008/0091979 | A1 * | 4/2008 | Okuda ........................ | 714/42 |

FOREIGN PATENT DOCUMENTS

KR    100269319 B1    7/2000
KR    1020040051197 A    6/2004

* cited by examiner

*Primary Examiner*—Son L Mai
(74) *Attorney, Agent, or Firm*—Baker & McKenzie LLP

(57) ABSTRACT

A column address decoding circuit of a semiconductor memory apparatus includes a predecoder configured to combine a column address and a decoding test signal, thereby outputting a decoding address. A main decoder receives the decoding address, thereby outputting a plurality of column select signals.

21 Claims, 3 Drawing Sheets

CIRCUIT AND METHOD FOR DECODING COLUMN ADDRESSES IN SEMICONDUCTOR MEMORY APPARATUS

CROSS-REFERENCES TO RELATED APPLICATION

The present application claims priority under 35 U.S.C. 119(a) to Korean application number 10-2007-0014572, filed on Feb. 12, 2007, which is incorporated by reference in its entirety as if set forth in full.

BACKGROUND

1. Field

The embodiments described herein relate to circuits and a methods for decoding column addresses in a semiconductor memory apparatus and more particularly, to circuits and a methods for decoding column addresses in a semiconductor memory apparatus so as to increase the speed of a parallel test and thereby shorten a test period.

2. Background

In a conventional semiconductor memory apparatus individual memory cells are activated for data input and output operations by activating associated word (or row) and column select lines. The word select lines are designated by row addresses and the column select lines are designated by column addresses. Often, conventional semiconductor memory apparatus are divided into parallel banks of cells. Accordingly, a conventional semiconductor memory apparatus is accessed by activating one of the plurality of memory banks, and then enabling the appropriate column select line.

In a multi-bank active operation, such as in a parallel test mode, a plurality of memory banks are all activated, and a data write operation is implemented in a manner such that the column select lines designated by column addresses are enabled one by one in each memory bank. The write test period can be shortened using such a parallel test mode, since the plurality of memory banks are simultaneously activated. However, in this case, the advantage obtained by the shortening of the test period is not substantial, even though the plurality of memory banks are activated in parallel This is because the column select signals are activated one by one in each memory bank, which still takes time.

In order to decode column addresses, a conventional semiconductor memory apparatus includes a predecoder, a main decoder and a pulse generation unit. The predecoder has a plurality of (for example, 3) predecoding sections for decoding 2 or 3-bits of plural-bit (for example, 8-bit) address. The main decoder implements a decoding operation using the pulse signal provided from the pulse generation unit. A column address decoding circuit of a conventional semiconductor memory apparatus configured in this way does not have any structure for recognizing the parallel test mode. Therefore, even in the parallel test mode, as in the normal operation, the operation is implemented in such a way as to enable the column select signals one by one. As a result, in a conventional semiconductor memory apparatus, the advantage obtained by shortening of the test period through realization of the parallel test mode is not substantial, and a technical limit exists in shortening the test period by conducting a parallel test.

SUMMARY

Circuits and methods for decoding column addresses in a semiconductor memory apparatus, which shorten a test period in a parallel test mode are described herein.

In one aspect, a column address decoding circuit is provided in a semiconductor memory apparatus that includes: a predecoder configured to combine a column address and a decoding test signal, thereby outputting a decoding address; and a main decoder configured to receive the decoding address, thereby outputting a plurality of column select signals.

In another aspect, a column address decoding circuit is provided in a semiconductor memory apparatus that includes: a test mode setting unit configured to enable a decoding test signal depending upon whether a parallel test signal is enabled; a predecoder configured to output a plurality of decoding addresses having a first level when the decoding test signal is enabled; a pulse generation unit configured to generate a pulse signal in response to a read command, a write command and the decoding test signal; and a main decoder configured to receive the pulse signal and enable a plurality of column select signals which correspond to the decoding addresses of the first level.

In still another aspect, a column address decoding method in a semiconductor memory apparatus includes: enabling a decoding test signal depending upon whether a parallel test signal is enabled; outputting a plurality of decoding addresses having a first level when the decoding test signal is enabled; and enabling a plurality of column select signals which correspond to the decoding addresses of the first level.

BRIEF DESCRIPTION OF THE DRAWINGS

The above objects, and other features and advantages will become more apparent after a reading of the following detailed description taken in conjunction with the drawings, in which.

DETAILED DESCRIPTION

Figure 1:
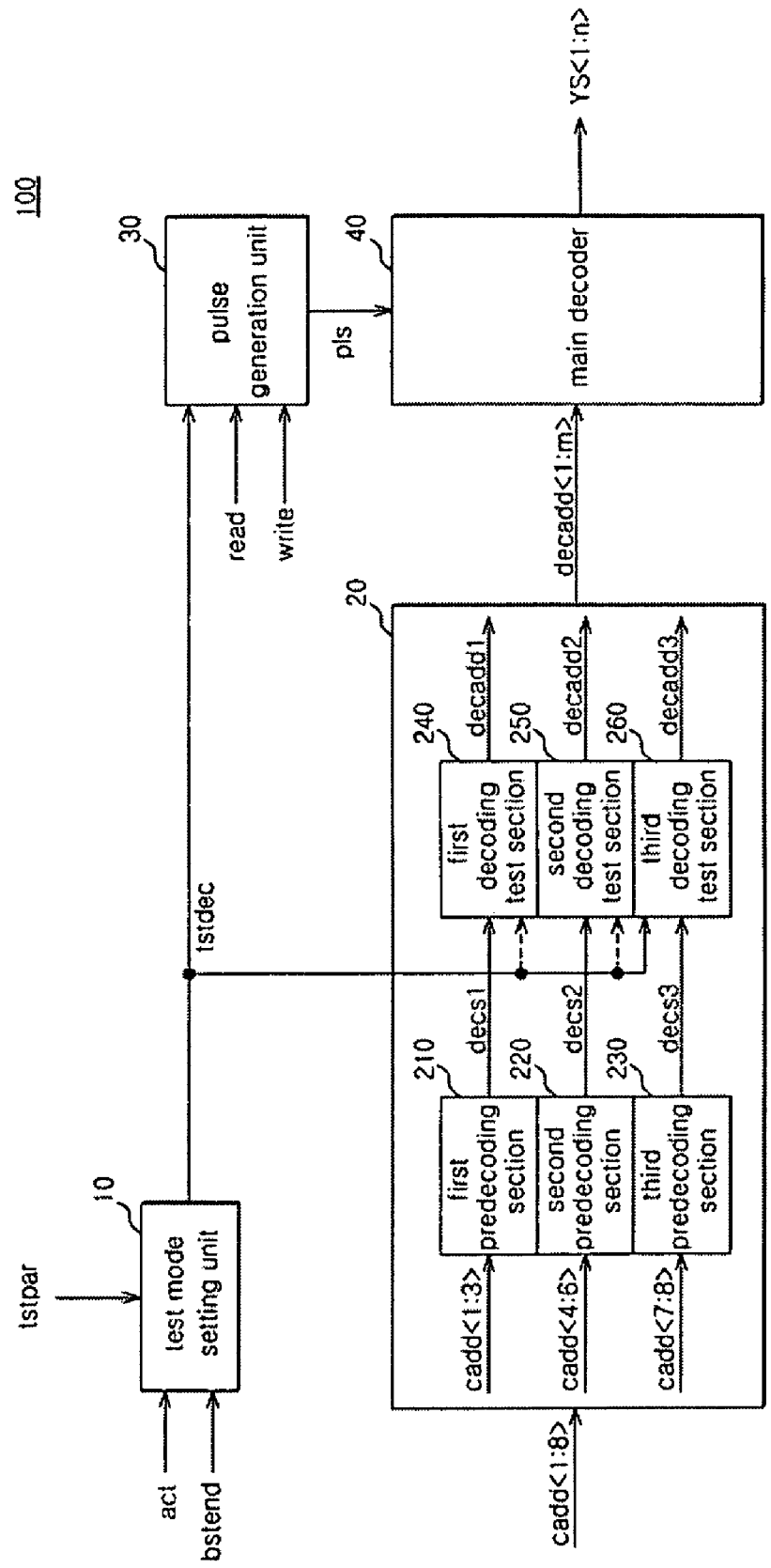
FIG. 1 is a block diagram illustrating the configuration of a circuit for decoding column addresses in a semiconductor memory apparatus in accordance with an embodiment.

Reference will now be made to certain embodiments, examples of which are illustrated in the accompanying drawings. Wherever possible, the same reference numerals will be used throughout the drawings and the description to refer to the same or like parts.

FIG. 1 is a block diagram illustrating an example configuration of a circuit 100 for decoding column addresses in a semiconductor memory apparatus in accordance with an embodiment. FIG. 1 exemplifies a column address decoding circuit 100 that has a predecoder 20 including three predecoding sections 210, 220, and 230 in order to decode 8-bit column addresses.

Referring to FIG. 1, the column address decoding circuit 100 includes a test mode setting unit 10, a predecoder 20, a pulse generation unit 30, and a main decoder 40.

The test mode setting unit 10 receives an active command 'act' and a burst end signal 'bstend' and generates a decoding test signal 'tstdec' depending upon whether a parallel test signal 'tstpar' is enabled.

The predecoder 20 combines 8-bit column addresses 'cadd<1:8>' with the decoding test signal 'tstdec', thereby outputting m-bit decoding addresses 'decadd<1:m>'.

The pulse generation unit 30 generates a pulse signal 'pls' in response to a read command 'read', a write command 'write' and the decoding test signal 'tstdec'.

The main decoder 40 receives the pulse signal 'pls' and the m-bit decoding addresses 'decadd<1:m>', thereby outputting a n-bit column select signals 'YS<1:n>' (here, m and n are integer numbers no less than 2).

The predecoder 20 includes a first predecoding section 210, a second predecoding section 220, a third predecoding section 230, a first decoding test section 240, a second decoding test section 250, and a third decoding test section 260.

The first predecoding section 210 decodes column address bits 1 to 3 'cadd<1:3>' of the 8-bit column address 'cadd<1:8>', thereby outputting a first decoding signal 'decs1' as a combination of a plurality of (for example, 8) signals.

The second predecoding section 220 decodes column address bits 4 to 6 'cadd<4:6>' of the 8-bit column address 'cadd<1:8>', thereby outputting a second decoding signal 'decs2' as a combination of a plurality of (for example, 8) signals.

The third predecoding section 230 decodes column address bits 7 and 8 'cadd<7:8>' of the 8-bit column address 'cadd<1:8>', thereby outputting a third decoding signal 'decs3' as a combination of a plurality of (for example, 4) signals.

The first decoding test section 240 receives the first decoding signal 'decs1' and the decoding test signal 'tstdec', thereby outputting a first decoding address 'decadd1' as a combination of a plurality of (for example, 8) signals.

The second decoding test section 250 receives the second decoding signal 'decs2' and the decoding test signal 'tstdec', thereby outputting a second decoding address 'decadd2' as a combination of a plurality of (for example, 8) signals.

The third decoding test section 260 receives the third decoding signal 'decs3' and the decoding test signal 'tstdec', thereby outputting a third decoding address 'decadd3' as a combination of a plurality of (for example, 4) signals.

Here, the total number of bits included in the first decoding address 'decadd1', the second decoding address 'decadd2' and the third decoding address 'decadd3' is m. Thus, the resulting m-bit decoding addresses 'decadd<1:m>' are expressed as a common designation of the first decoding address 'decadd1', the second decoding address 'decadd2' and the third decoding address 'decadd3'.

The decoding test signal 'tstdec' can be transmitted to at least one of the first through third decoding test sections 240, 250 and 260 of the predecoder 20. Whether the decoding test signal 'tstdec' is transmitted to some or all of the first through third decoding test sections 240, 250 and 260 is dependent on the requirements of a specific implementation.

Here, an example in which the decoding test signal 'tstdec' is transmitted to the third decoding test section 260 will be explained. In this case, the third predecoding section 230 decodes the column addresses 7 and 8 'cadd<7:8>', thereby outputting the third decoding signal 'decs3' as a combination of a plurality of (for example, 4) signals. The third decoding test section 260 combines the decoding test signal 'tstdec' and the third decoding signal 'decs3', thereby outputting the third decoding address 'decadd3'. At this time, if the decoding test signal 'tstdec' is disabled, the third decoding signal 'decs3' is output as the third decoding address 'decadd3', and the third decoding address 'decadd3' has the same logic value as the third decoding signal 'decs3'. Conversely, if the decoding test signal 'tstdec' is enabled, all the bits included in the third decoding address 'decadd3' has a first level (for example, a high level).

The configuration of the predecoder 20 as described above was given as an example for the sake of convenience in explanation. Therefore, it is to be understood that the configuration of the predecoder 20 is not limited to that illustrated in FIG. 1 and a predecoder having more or less predecoding sections and decoding test sections can also be implement in accordance with the embodiments described herein.

Returning to FIG. 1, with the parallel test signal 'tstpar' enabled, if the active command 'act' is input, the test mode setting unit 10 enables the decoding test signal 'tstdec'. Thereafter, if the burst end signal 'bstend' is input, the test mode setting unit 10 disables the decoding test signal 'tstdec'.

The main decoder 40 decodes the m-bit decoding addresses 'decadd<1:m>', thereby generating the n-bit column select signals 'YS<1:n>'. In other words, depending upon the logic value of the m-bit decoding addresses 'decadd<1:m>' transmitted to the main decoder 40, a corresponding column select signal 'YS<i>' is enabled. At this time, if all the signals included in the third decoding address 'decadd3' have a first level (for example, a high level), the main decoder 40 enables a plurality of column select signals YS<i:i+x> which correspond to the logic value of the third decoding address 'decadd3' (i is an optional integer number from 1 to n−x, and x is an integer number). For this operation, the main decoder 40 receives the pulse signal 'pls'.

The pulse generation unit 30 generates the pulse signal 'pls' in response to the input of the read command 'read', the write command 'write' and the decoding test signal 'tstdec'. In general, a column address decoding circuit of a conventional semiconductor memory apparatus has a pulse generation unit that generates the pulse signal 'pls' using the read command 'read' and the write command 'write'. But in the column address decoding circuit 100 of a semiconductor memory apparatus of FIG. 1, the pulse signal 'pls' is generated by additionally combining the decoding test signal 'tstdec'. In this manner, it is possible to generate a pulse signal that has a wider enabling range than the pulse signal that is used in a conventional column address decoding circuit in a parallel test mode. This technique is used to prevent a side effect where the driving force of the main decoder 40 is decreased as the main decoder 40 conducts the operation for simultaneously enabling the plurality of column select signals 'YS<i:i+x>'.

Figure 2:
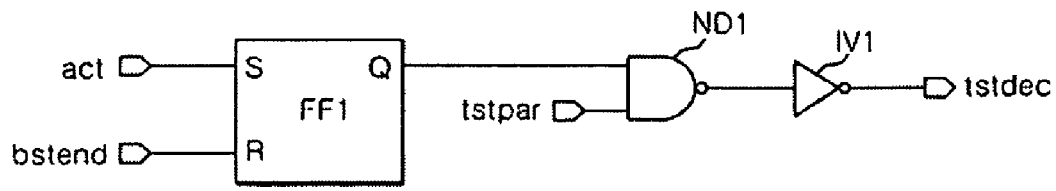
FIG. 2 is a detailed view of a test mode setting unit included in the circuit shown in FIG. 1.

Referring to FIG. 2, the test mode setting unit 10 includes a first flip-flop FF1 receiving the active command 'act' through a set terminal S and the burst end signal 'bstend' through a reset terminal R, a first NAND gate ND1 receiving the output signal of the first flip-flop FF1 and the parallel test signal 'tstpar', and a first inverter IV1 receiving the output signal of the first NAND gate ND1 and outputs the decoding test signal 'tstdec'.

In this configuration, with the parallel test signal 'tstpar' enabled, if the active command 'act' is input, the decoding test signal 'tstdec' is enabled, and if the burst end signal 'bstend' is input, the decoding test signal 'tstdec' is disabled.

Figure 3:
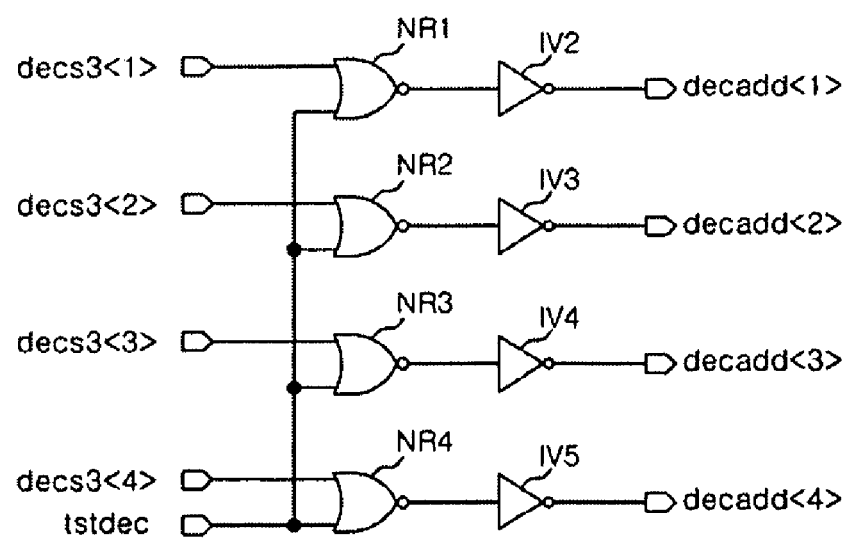
FIG. 3 is a detailed view of a third decoding test section included in the circuit shown in FIG. 1.

FIG. 3 is a detailed view of the third decoding test section 260 shown in FIG. 1. FIG. 3 exemplifies the third decoding test section 260 provided for parallel testing of the column select signals 'YS<i:i+x>', which correspond to the column addresses 7 and 8 'cadd<7:8>' input to the third predecoding section 230. Assuming that the third decoding signal 'decs3' is a combination of four signals as described above, the third decoding signal 'decs3' is denoted as third decoding signals 1 to 4 'decs3<1:4>'. Further, assuming that the third decoding address 'decadd3' is a combination of four signals as described above, the third decoding address 'decadd3' is denoted as third decoding signals 1 to 4 'decadd3<1:4>'.

The third decoding test section 260 includes a first NOR gate NR1, a second NOR gate NR2, a third NOR gate NR3, a fourth NOR gate NR4, a second inverter IV2, a third inverter IV3, a fourth inverter IV4, and a fifth inverter IV5.

The first NOR gate NR1 receives the third decoding signal 1 'decs3<1>' and the decoding test signal 'tstdec'.

The second inverter IV2 receives the output signal of the first NOR gate NR1 and outputs the third decoding address bit 1 'decadd3<1>'.

The second NOR gate NR2 receives the third decoding signal 2 'decs3<2>' and the decoding test signal 'tstdec'.

The third inverter IV3 receives with the output signal of the second NOR gate NR2 and outputs the third decoding address bit 2 'decadd3<2>'.

The third NOR gate NR3 receives the third decoding signal 3 'decs3<3>' and the decoding test signal 'tstdec'.

The fourth inverter IV4 receives the output signal of the third NOR gate NR3 and outputs the third decoding address bit 3 'decadd3<3>'.

The fourth NOR gate NR4 receives the third decoding signal 4 'decs3<4>' and the decoding test signal 'tstdec'.

The fifth inverter IV5 receives the output signal of the fourth NOR gate NR4 and outputs the third decoding address bit 4 'decadd3<4>'.

In this configuration, if the decoding test signal 'tstdec' is disabled, the third decoding signal 'decs3' is output as the third decoding address bit 'decadd3'. Conversely, if the decoding test signal 'tstdec' is enabled, irrespective of the third decoding signal 'decs3', the third decoding address bit 'decadd3' becomes a combination of high level signals.

While the third decoding test section 260 is exemplified in FIG. 3, the first and second decoding test sections 240 and 250 can be configured in a similar manner. Also, any signal of the m-bit decoding addresses 'decadd<1:m>' can be controlled in its logic value through the decoding test sections, e.g., shown in FIG. 3, and through this, any column select signal 'YS<i>' can be enabled in a parallel test mode. Moreover, it will also be understood that only some decoding signals in a certain decoding test section can be combined with the decoding test signal 'tstdec' depending on the implementation.

Figure 4:
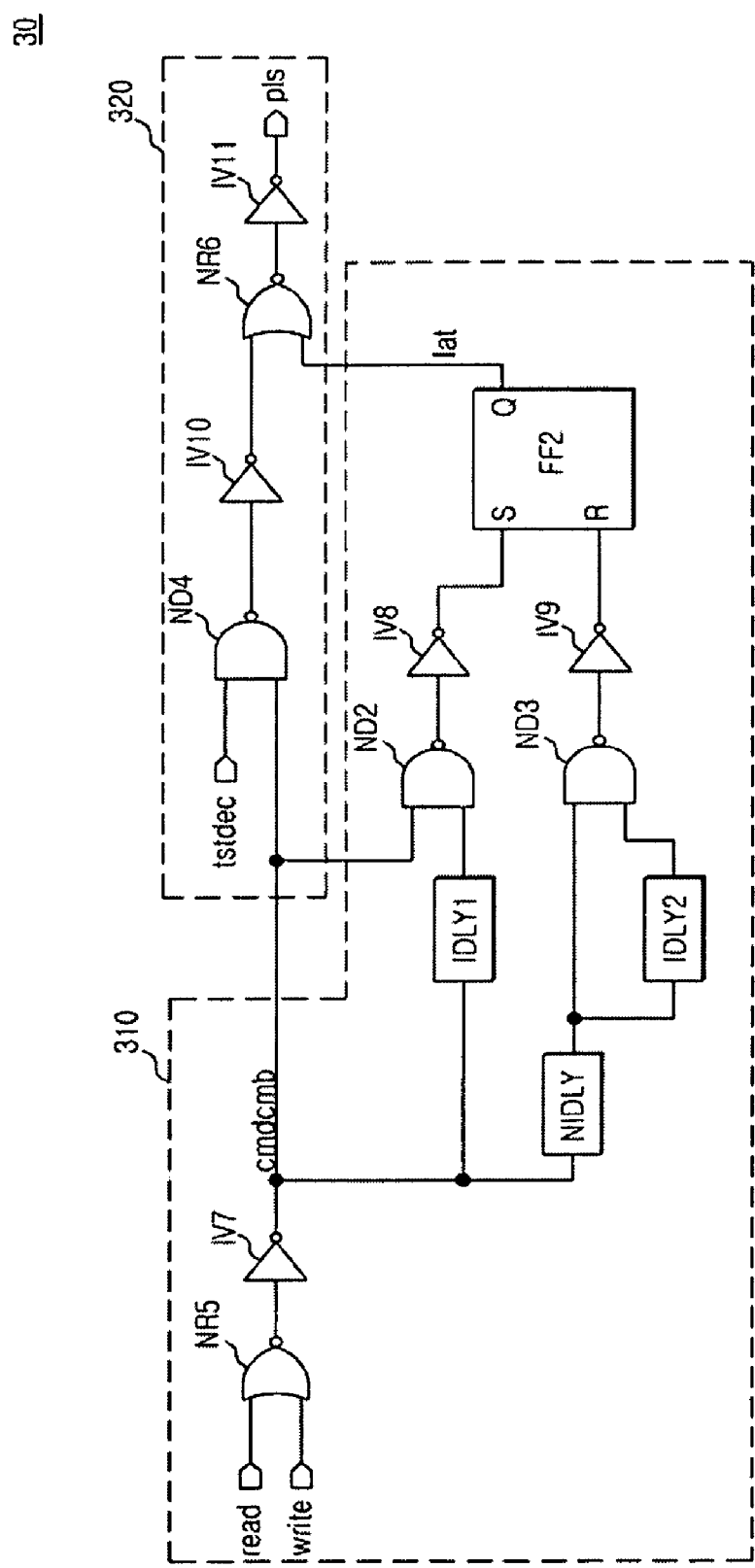
FIG. 4 is a detailed view of a pulse generation unit included in the circuit shown in FIG. 1.

Referring to FIG. 4, the pulse generation unit 30 includes a latch section 310 receiving the read command 'read' and the write command 'write', thereby generating a combined command signal 'cmdcmb' and a latch signal 'lat', and a signal combining section 320 generating the pulse signal 'pls' in response to the input of the decoding test signal 'tstdec', the combined command signal 'cmdcmb' and the latch signal 'lat'.

Here, the latch section 310 includes a fifth NOR gate NR5, a seventh inverter IV7, an eighth inverter IV8, a ninth inverter IV9, a first invert delay element IDLY1, a second invert delay element IDLY2, non-invert delay element NIDLY, a second NAND gate ND2, a third NAND gate ND3, and a second flip-flop FF2.

The fifth NOR gate NR5 receives the read command 'read' and the write command 'write'.

The seventh inverter IV7 receives the output signal of the fifth NOR gate NR5 and outputs the combined command signal 'cmdcmb'.

The first invert delay element IDLY1 receives the combined command signal 'cmdcmb'.

The second NAND gate ND2 receives the combined command signal 'cmdcmb' and the output signal of the first inversion delay element IDLY1.

The eighth inverter IV8 receives the output signal of the second NAND gate ND2.

The non-invert delay element NIDLY receives the combined command signal 'cmdcmb'.

The second invert delay element IDLY2 receives the output signal of the non-inversion delay element NIDLY.

The third NAND gate ND3 receives the output signal of the non-invert delay element NIDLY and the output signal of the second invert delay element IDLY2.

The ninth inverter IV9 receives the output signal of the third NAND gate ND3.

The second flip-flop FF2 receives the output signal of the eighth inverter IV8 through a set terminal S and the output signal of the ninth inverter IV9 through a reset terminal R and outputs the latch signal 'lat'.

The signal combining section 320 includes a fourth NAND gate ND4, a sixth NOR gate NR6, a tenth inverter IV10, and an eleventh inverter IV11.

The fourth NAND gate ND4 receives the decoding test signal 'tstdec' and the combined command signal 'cmdcmb'.

The tenth inverter IV10 receives the output signal of the fourth NAND gate ND4.

The sixth NOR gate NR6 receives the output signal of the tenth inverter IV10 and the latch signal 'lat'.

The eleventh inverter IV11 receives the output signal of the sixth NOR gate NR6 and outputs the pulse signal 'pls'.

Here, the latch section 310 may be a pulse generator that is generally used in the column decoding circuit of a conventional semiconductor memory apparatus. Therefore, in a conventional apparatus, the latch signal 'lat' is transmitted to the main decoder 40 to support the decoding operationIn a low frequency environment, however, where the parallel test mode is conducted, the driving force is often insufficient for the main decoder 40 to simultaneously enable the plurality of column select signals 'YS<i:i+x>' using the latch signal 'lat'. Accordingly, in certain embodiments, the pulse generation unit 30 can be configured to include the signal combining section 320. In this configuration, since the pulse signal 'pls' having the same pulse width as the read command 'read' or the write command 'write' is generated when the decoding test signal 'tstdec' is enabled, the pulse signal 'pls', having a greater width than the latch signal 'lat', can support the decoding operation of the main decoder 40.

As described above, decoding test signals are generated in the circuit 100 for decoding column addresses in a semiconductor memory apparatus in response to the input of a parallel test signal. When the decoding test signals are enabled, all decoding addresses associated with the decoding test signals are controlled to a first level (for example, a high level). As a consequence, a test period can be shortened advantageously in a parallel test mode, since a plurality of column select signals are simultaneously enabled. Further, by increasing the width of a pulse signal so as to support the decoding operation of a main decoder, it is possible to solve the side effect that the driving force of the main decoder is decreased as the plurality of column select signals are simultaneously enabled.

As is apparent from the above description, the circuits and the methods for decoding column addresses in a semiconductor memory apparatus as described herein provide advantages in that, since a plurality of column select signals are simultaneously enabled in a parallel test mode, a test period can be shortened.

Further, the circuits and the methods for decoding column addresses in a semiconductor memory apparatus as described herein provide advantages in that, because decoding operations are implemented in a parallel test mode using a pulse signal having an increased width, the driving force of a main decoder can be increased.

Although certain embodiments have been described for illustrative purposes, those skilled in the art will appreciate that various modifications, additions and substitutions are possible, without departing from the scope and the spirit of the invention as disclosed in the accompanying claims.

What is claimed is:

1. A column address decoding circuit in a semiconductor memory apparatus, comprising:
   a predecoder configured to combine a column address and a decoding test signal, thereby outputting a decoding address; and
   a main decoder configured to receive the decoding address, thereby outputting a plurality of column select signals,
   wherein, in a parallel test, the decoding test signal is enabled in response to input of an active command and is disabled in response to input of a burst end signal.

2. The column address decoding circuit according to claim 1, wherein the predecoder comprises:
   a predecoding section configured to decode plural-bit column addresses, thereby outputting a decoding signal as a combination of a plurality of signals; and
   a decoding test section configured to receive the decoding signal and the decoding test signal, thereby outputting a decoding address as a combination of a plurality of signals.

3. The column address decoding circuit according to claim 2, wherein, when the decoding test signal is enabled, the decoding test section is configured to output, as a signal having a first level, a signal included in the decoding address which corresponds to a signal among signals included in the decoding signal which is combined with the decoding test signal.

4. The column address decoding circuit according to claim 3, wherein the decoding test section comprises:
   a NOR gate configured to receive any one signal included in the decoding signal and the decoding test signal; and
   an inverter configured to receive an output signal of the NOR gate and output any one signal to be included in the decoding address.

5. The column address decoding circuit according to claim 1, further comprising:
   pulse generation unit configured to generate a pulse signal in response to input of a read command, a write command and the decoding test signal and transmit the generated pulse signal to the main decoder.

6. The column address decoding circuit according to claim 5, wherein the pulse generation unit is configured to generate the pulse signal which has a greater pulse width when the decoding test signal is enabled than when the decoding test signal is disabled.

7. The column address decoding circuit according to claim 6, wherein the pulse generation unit comprises:
   a latch section configured to receive the read command and the write command, thereby generating a combined command signal and a latch signal; and
   a signal combining unit configured to generate the pulse signal in response to input of the decoding test signal, the combined command signal and the latch signal.

8. A column address decoding circuit in a semiconductor memory apparatus, comprising:
   a test mode setting unit configured to enable a decoding test signal depending upon whether a parallel test signal is enabled;
   a predecoder configured to output a plurality of decoding addresses having a first level when the decoding test signal is enabled;
   a pulse generation unit configured to generate a pulse signal in response to a read command, a write command and the decoding test signal; and
   a main decoder configured to receive the pulse signal and enable a plurality of column select signals which correspond to the decoding addresses of the first level.

9. The column address decoding circuit according to claim 8, wherein, with the parallel test signal enabled, the test mode setting unit is configured to enable the decoding test signal when an active command is input, and thereafter disable the decoding test signal when a burst end signal is input.

10. The column address decoding circuit according to claim 9, wherein the test mode setting unit comprises:
    a flip-flop configured to receive the active command through a set terminal and the burst end signal through a reset terminal;
    a NAND gate configured to receive an output signal of the flip-flop and the parallel test signal; and
    an inverter configured to receive an output signal of the NAND gate and output the decoding test signal.

11. The column address decoding circuit according to claim 8, wherein the predecoder comprises:
    a predecoding section configured to decode plural-bit column addresses, thereby outputting a decoding signal as a combination of a plurality of signals; and
    a decoding test section configured to receive the decoding signal and the decoding test signal, thereby outputting a decoding address as a combination of a plurality of signals.

12. The column address decoding circuit according to claim 11, wherein, when the decoding test signal is enabled, the decoding test section is configured to output, as a signal having the first level, a signal included in the decoding address which corresponds to a signal among signals included in the decoding signal which is combined with the decoding test signal.

13. The column address decoding circuit according to claim 12, wherein the decoding test section comprises:
    a NOR gate configured to receive any one signal included in the decoding signal and the decoding test signal; and
    an inverter configured to receive an output signal of the NOR gate and output any one signal to be included in the decoding address.

14. The column address decoding circuit according to claim 8, wherein the pulse generation unit is configured to generate the pulse signal which has a greater pulse width when the decoding test signal is enabled than when the decoding test signal is disabled.

15. The column address decoding circuit according to claim 14, wherein the pulse generation unit comprises:
    a latch section configured to receive the read command and the write command, thereby generating a combined command signal and a latch signal; and
    a signal combining section configured to generate the pulse signal in response to input of the decoding test signal, the combined command signal and the latch signal.

16. A column address decoding method in a semiconductor memory apparatus, comprising:
    enabling a decoding test signal depending upon whether a parallel test signal is enabled;
    outputting a plurality of decoding addresses having a first level when the decoding test signal is enabled; and
    enabling a plurality of column select signals which correspond to the decoding addresses of the first level;
    wherein, in the enabling a decoding test signal, with the parallel test signal enabled, the decoding test signal is enabled when an active command is input and thereafter is disabled when a burst end signal is input.

17. The column address decoding method according to claim 16, wherein the outputting a plurality of decoding addresses comprises:

decoding plural-bit column addresses, thereby generating a decoding signal as a combination of a plurality of signals; and receiving the decoding signal and the decoding test signal, thereby generating a decoding address as a combination of a plurality of signals.

18. The column address decoding method according to claim 17, wherein, in the generating a decoding address, when the decoding test signal is enabled, a voltage level of a signal included in the decoding address, which corresponds to a signal among signals included in the decoding signal, which is combined with the decoding test signal, is controlled to the first level.

19. The column address decoding method according to claim 16, further comprising:

generating a pulse signal in response to a read command, a write command and the decoding test signal; and transmitting the pulse signal to the enabling the plurality of column select signals.

20. The column address decoding method according to claim 19, wherein, in the generating a pulse signal, the pulse signal, which has a greater pulse width when the decoding test signal is enabled than when the decoding test signal is disabled, is generated.

21. The column address decoding method according to claim 20, wherein the generating a pulse signal comprises:

receiving the read command and the write command, thereby generating a combined command signal and a latch signal; and outputting the pulse signal in response to the decoding test signal, the combined command signal and the latch signal.

* * * * *